United States Patent [19]

Hoddinott

[11] Patent Number: 4,620,984

[45] Date of Patent: Nov. 4, 1986

[54] METAL VAPOR DEPOSITION METHOD AND APPARATUS

[75] Inventor: Dudley S. Hoddinott, Oxford, England

[73] Assignee: United Kingdom Atomic Energy Authority, London, England

[21] Appl. No.: 658,705

[22] Filed: Oct. 9, 1984

[30] Foreign Application Priority Data

Oct. 28, 1983 [GB] United Kingdom ............... 8328858

[51] Int. Cl.⁴ ............................................ C23C 16/06
[52] U.S. Cl. .................................. 427/9; 118/665; 118/724; 118/725; 427/10; 427/250
[58] Field of Search ................... 427/9, 10, 250; 118/665, 724, 725

[56] References Cited

U.S. PATENT DOCUMENTS

| | | | |
|---|---|---|---|
| 3,015,586 | 1/1962 | Toohig et al. | 118/725 |
| 3,654,109 | 4/1972 | Hohl et al. | 427/9 |
| 4,051,270 | 9/1977 | Butler | 427/9 |
| 4,151,064 | 4/1979 | Kuehnle | 204/298 |
| 4,517,027 | 5/1985 | Bickerdike et al. | 427/250 |

FOREIGN PATENT DOCUMENTS

| | | | |
|---|---|---|---|
| 0091734 | 10/1983 | European Pat. Off. | 427/250 |
| 1206586 | 9/1970 | United Kingdom | 427/250 |
| 1443144 | 7/1976 | United Kingdom | 118/665 |
| 2079324 | 1/1982 | United Kingdom | 427/250 |

Primary Examiner—Sadie L. Childs
Attorney, Agent, or Firm—William R. Hinds

[57] ABSTRACT

A method and an apparatus are provided for the production of a layer of a metallic material by deposition from the vapor phase onto an exposed surface of a collector. The exposed surface is maintained at a desired temperature by passing a heat transfer liquid through ducts within the collector and controlling the temperature of the liquid in accordance with the thickness of the deposited layer.

5 Claims, 3 Drawing Figures

METAL VAPOR DEPOSITION METHOD AND APPARATUS

This invention relates to the production of a metallic material by deposition from the vapour phase onto a surface of a collector, and more particularly but not exclusively to the production by deposition from the vapour phase of aluminium alloys.

Methods for producing various metallic materials, and in particular alloys containing aluminium, are described in British Patent Specifications Nos. 1 206 586 and 2 079 324 A. The deposition takes place in an evacuated chamber in which are situated a heated source from which the alloy constituents are evaporated, and a surface of a collector.

The collector may be a flat plate, or may be a cylinder; if a flat plate, it may be held stationary above the source, or may be traversed in a horizontal plane in a reciprocating motion over the source, while if a cylinder, it may be rotated about its longitudinal axis above the source. The temperature of the surface onto which deposition occurs can have a pronounced effect on the structure of the deposit.

According to the present invention there is provided a method for producing a layer of a metallic material by deposition from the vapour phase onto a collector so as to form the layer thereon, wherein the method includes passing a heat transfer fluid through ducts in thermal contact with the collector, measuring the thickness of the layer, and adjusting the temperature of the inflowing heat transfer fluid in accordance with the thickness of the layer so as to maintain the outer surface of the layer at a predetermined temperature.

The invention also provides an apparatus for deposition from the vapour phase of a layer of a metallic material comprising, a chamber adapted to be evacuated, a heated source within the chamber for evaporating the constituents of the material, a collector within the chamber for deposition of the layer thereon, ducts in thermal contact with the collector for passage of a heat transfer fluid, means for causing the fluid to flow through the ducts, means for controlling the tempeature of the fluid, and sensing means for determining the thickness of the layer, the temperature control means controlling the tempeature of the fluid in accordance with the thickness of the layer so as to maintain the outer surface of the layer at a predetermined temperature.

The invention will now be further described by way of example only and with reference to the accompanying drawings, in which.

Figure 1:
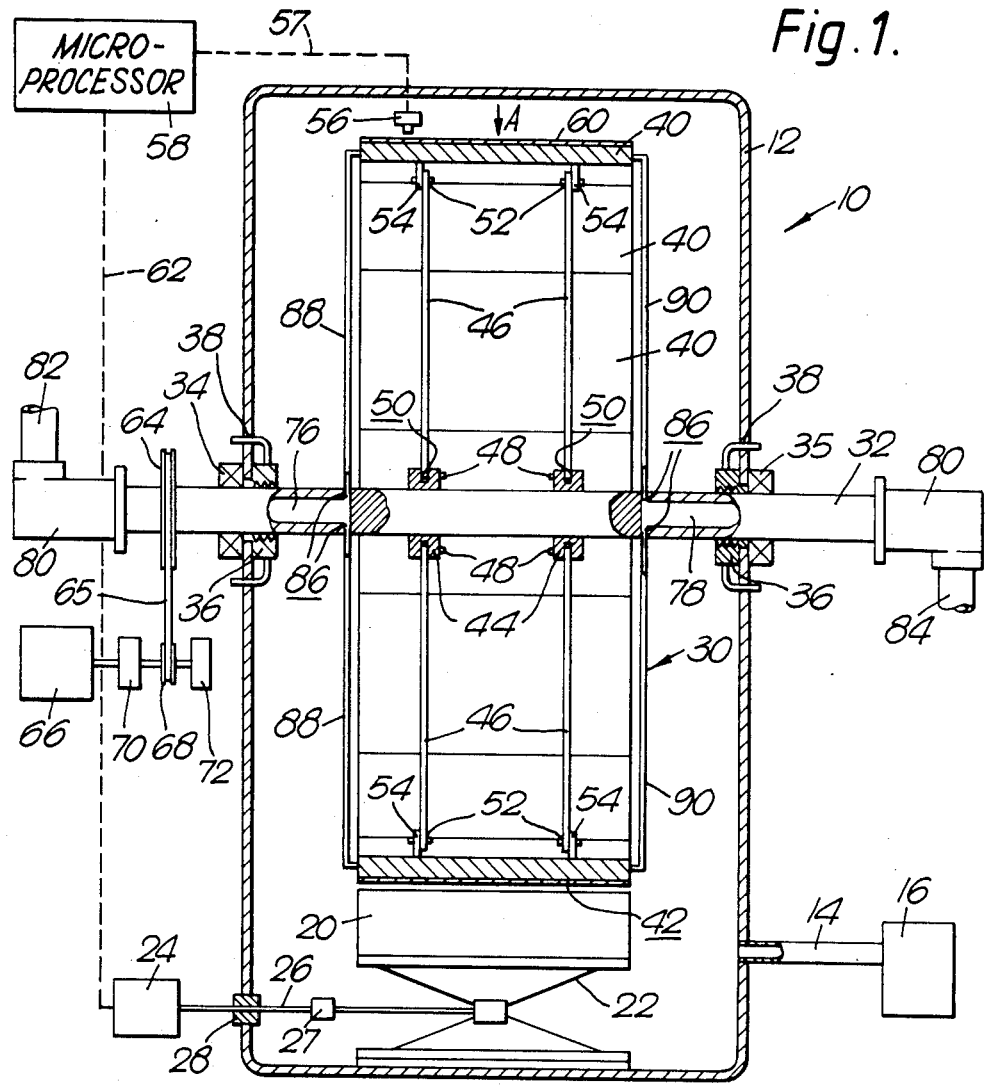
FIG. 1 shows a diagrammatic sectional view through part of a metal vapour deposition apparatus.

Referring to FIG. 1, a metal vapour deposition apparatus 10 comprises a chamber 12 connected by a pipe 14 to a vacuum pump 16 by means of which the chamber 12 can be evacuated. The chamber 12 contains an evaporating source 20 supported on a scissor lift 22 which is powered by an electric motor 24 outside the chamber 12, a driving shaft 26 from the motor 24 to the scissor lift 22 passing through a rotary seal 28 in the side of the chamber 12, and incorporating a universal joint 27. Above the evaporating source 20 is a rotary cylindrical drum 30 supported by a horizontal shaft 32 located by bearings 34 and 35 respectively at opposite sides of the chamber 12 and by Ferrofluid seals 36 (shown diagrammatically) to which a coolant liquid is supplied by pipes 38.

The drum 30 comprises, twelve identical arcuate portions 40 connected together to define a cylindrical outer surface 42 of the drum 30, two hub members 44 fixed to the shaft 32, and twenty four identical spoke members 46, each hub member 44 being connected by a respective spoke member 46 to each of the arcuate portions 40. Each spoke member 46 locates at one end in a circumferential groove 50 around the respective hub member 44, and is pivotally connected thereto by a bolt 48 through the hub member 44, and at the other end is pivotally connected by a bolt 52 to a lug 54 defined on the inside of the arcuate portion 40. The spoke members 46 are not aligned radially, but are all aligned at the same oblique angle to the radius of the drum 30 at the respective bolt 48, and the oblique angle might be for example 73° at ambient temperatures.

A non-contact ultrasonic distance sensor 56 is mounted in the upper part of the chamber 12 directly above the drum 30 to measure the thickness of a metal layer 60 deposited onto the outer surface 42 in operation of the apparatus 10, the sensor 56 being connected by a lead 57 (all electrical leads being represented in FIGS. 1 and 3 by broken lines) to a microprocessor 58 which is connected by a control lead 62 to the motor 24.

The shaft 32 carries a pulley 64 outside the chamber 12 over which passes a drive belt 65. An electrical motor 66 is arranged to drive the drive belt 65 by means of a pulley 68 driven through a clutch unit 70, and connected to a brake unit 72. The end portions of the shaft 32 are hollow and define blind-ended bores 76 and 78 for the inlet and outlet of a heat transfer liquid, and each end of the shaft 32 locates in a respective liquid-tight rotary union 80 by which the inlet bore 76 and the outlet bore 78 connect to pipes 82 and 84 respectively of a heat transfer liquid circuit to be described latler. Twelve equally spaced ducts 86 extend radially outwards from each bore 76 or 78 near the blind end thereof to communicate with respective flexible tubes 88 or 90 connected to opposite sides of each of the arcuate members 40 of the drum 30.

Figure 2:
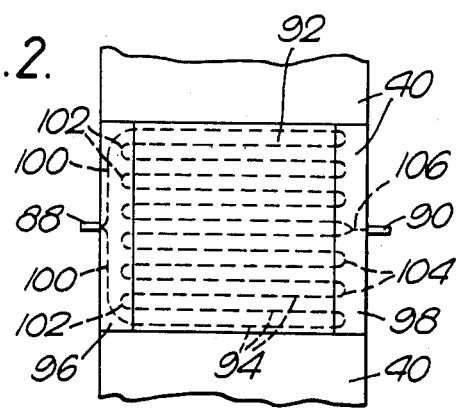
FIG. 2 shows a view in the direction of arrow A of FIG. 1.

Referring now to FIG. 2, each arcuate portion 40 has a central portion 92 through which are defined a large number (double an odd number) of parallel ducts 94 extending parallel to the axis of rotation of the drum 30, an inlet manifold portion 96 to which the respective tube 88 connects and an outlet manifold portion 98 to which the respective tube 90 connects. Two ducts 100 within the inlet manifold portion 96 connect the tube 88 to the outermost ducts 94, and ducts 102 connect alternate pairs of the other ducts 94. Within the outlet manifold portion 98, ducts 104 connect alternate pairs of the ducts 94, and a duct 106 connects the central pair of ducts 94 to the tube 90, so ensuring the heat transfer liquid follows a zig-zag path through the ducts 94 before emerging into the tube 90.

Figure 3:
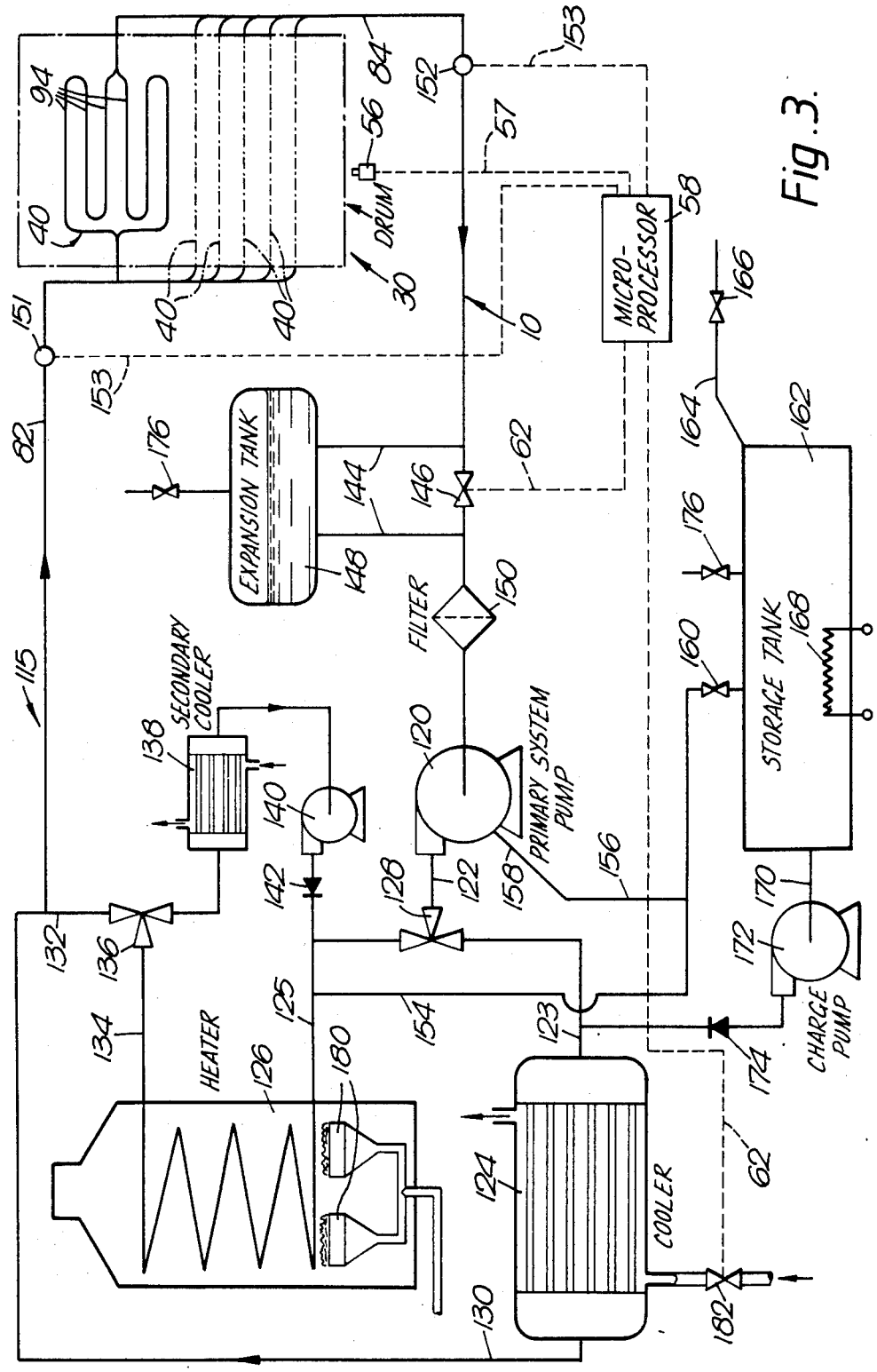
FIG. 3 shows a diagrammatic view of a temperature control system of the apparatus of FIG. 1.

Referring now to FIG. 3, the pipes 82 and 84 are part of a temperature control system 115 utilising a heat transfer liquid such as Dowtherm G40 (available from Dow Chemical Co. Ltd., Hounslow, London, U.K.). The system 115 incorporates a primary system pump 120 having an outlet 122 arranged to discharge either to an input 123 of a cooler 124, or to an input 125 of a heater 126 depending on the setting of a three-port valve 128 to which the outlet 122 connects. The cooler 124 has an outlet 130 connected to the pipe 82 via a T-junction 132, while the heater 126 has an outlet 134 connected via a three-port valve 136 either to the T-junction 132 (and so to the pipe 82), or via a secondary cooler 138, a pump 140, and a one-way valve 142 to the input 125 of the heater 126. The pipe 84 connects to the primary system pump 120 through a variable throttle valve 146 (by-passed by relatively narrow bore pipes 144 and an expansion tank 148) and through a filter 150, the variable throttle valve 146 being connected to the microprocessor 58 by a control lead 62. Temperature sensors 151 and 152 are provided to sense the liquid temperatures in the pipes 82 and 84 respectively, and are connected to the microprocessor 58 by leads 153.

Drain pipes 154 and 156 connect the inlet 125 of the heater 126, and an outlet 158 of the primary system pump 120 respectively, through a common drain valve 160 to a storage tank 162. The storage tank 162 has an inlet 164 controlled by a valve 166, and contains an electrical heater 168. An outlet 170 of the storage tank 162 connects through a charge pump 172 and a one-way valve 174 to the inlet 123 of the cooler 124. Both the storage tank 162 and the expansion tank 148 are provided with excess pressure vent valves 176.

If the liquid is passed through the heater 126 it may be heated by gas burners 180, while if passed through the cooler 124 or the secondary cooler 138 it is cooled by thermal contact with water. The water flow into the cooler 124 is controlled by a electrically operated variable valve 182, to which is connected a control lead 62 from the microprocessor 58.

Before operation of the temperature control system 115 of the apparatus 10 the storage tank 162 is filled with the heat transfer liquid through the inlet 164, and the drain valve 160 is closed. The liquid within the storage tank 162 is maintained at about 20° C. by the electrical heater 168. By operation of the charge pump 172 all the pipes of the system 115 are filled with the heat transfer liquid.

If it is desired to raise the temperature of the drum 30 (shown diagrammatically in FIG. 3), the three-part valve 128 is operated to connect the outlet 122 of the primary system pump 120 to the heater inlet 125, the three-port valve 136 is operated to connect the heater outlet 134 to the T-junction 132, while the pump 140 remains switched off. The priamry system pump 120 is then operated to discharge the liquid through the heater 126, where it is heated by the burners 180, then through the pipe 82 to the drum 30 so as to follow the aforedescribed zig-zag path through the ducts 94 of the arcuate portions 40, and so back to the primary system pump 120 through the pipe 84 and the filter 150. A the flows through the twelve portions 40 are in parallel, each portion 40 should reach the same temperature.

If it is desired to remove heat from the drum 30, the burners 180 are turned off, the pump 140 is switched on, water is passed through the cooler 124 and the secondary cooler 138, and the three-port valves 128 and 136 are operated simultaneously to connect the outlet 122 to the cooler inlet 123 and the heater outlet 134 to the secondary cooler 138. The liquid remaining in the heater 126 is circulated by the pump 140 through the secondary cooler 138, so removing any residual heat from the heater 126. The primary system pump 120 is then operated to pump the liquid through the cooler 124, through the pipe 82 to the drum 30, through the drum 30 to the pipe 84, and so back to the primary system pump 120. The cooler 124 removes heat from the liquid, the rate of heat removal, and hence the temperature of the liquid entering the drum 30, being controlled by adjusting the variable valve 182 so as to adjust the rate at which water flows through the cooler 124.

In operation of the metal vapour deposition apparatus 10 to produce an aluminium alloy, the chamber 12 is evacuated, and the rotary drum 30 is rotated on the shaft 32 by the motor 66. Initially the temperature control system 115 is used to raise the temperature of the drum 30, as described above, until the temperature of the outer surface 42 is 300° C. Thermal expansion of the arcuate portions 40 is accommodated by rotation of the portions 40 relative to the hub members 44, so changing the oblique angle at which the spoke members 46 are aligned. The temperature of the arcuate portions 40 is monitored indirectly by the microprocessor 58 by means of the sensors 151 and 152.

The evaporating source 20, containing the constituents of the alloy, is heated electrically to a temperature of about 1700° C. At this temperature the constituents are molten, and vapour therefrom condenses onto the outer surface 42 of the drum 30 to form the layer 60 of the alloy. The drum 30 receives heat due to the condensation of the vapour and due to radiation from the evaporating source 20, and the tempeature control system 115 is operated as described above to remove heat from the drum 30 at such a rate as to maintain the temperature of the exposed surface of the layer 60 at 300° C. Throughout the deposition process the thickness of the layer 60 is monitored by the sensor 56, the microprocessor 58 operating the motor 24 of the scissor lift 22 to maintain a substantially constant distance between the melt surface within the evaporating source 20 and the exposed surface of the layer 60.

After deposition of a thin layer 60 with the exposed surface of the layer 60 being held at a temperature of 300° C. the microprocessor 58 operates the throttle valve 146 and the variable valve 182 so as to reduce the temperature of the exposed surface of the layer 60, onto which the deposition occurs, to 250° C. and then to maintain it at that temperature throughout the remainder of the deposition process.

The heat flux received by the exposed surface of the layer 60 is substantially constant, so that as the thickness of the layer 60 increases the mean temperature of the liquid in the ducts 94 must be reduced to maintain the exposed surface of the layer 60 at a constant temperature. The microprocessor 58, in response to signals from the sensor 56, controls the variable valve 182 of the cooler 124 to provide the appropriate temperature of the liquid entering the drum 30. In addition, the rate of flow of the liquid is controlled by signals to the throttle valve 146 to ensure that the temperature difference between the liquid entering the drum 30 and that leaving, as detected by the sensors 151 and 152 respectively, does not exceed about 10° C., so that the temperature over the exposed surface of the layer 60 is substantially uniform. To keep the exposed surface at 250° C. when the layer 60 is very thin, the appropriate inflow liquid temperature is 235° C., while with a layer 60 which is 50 mm thick the appropriate temperature is about 190° C., and with a layer 60 which is 150 mm thick the appropriate temperature is about 100° C.

It will be appreciated that the appropriate temperature of the liquid depends not only on the thickness of the layer 60, as detected by the sensor 56, but also on the thickness of the material between the ducts 94 and the outer surface 42 of the drum 30, on the thermal conductivity of the material of the arcuate portions 40, and on the thermal conductivity of the alloy deposited, and that the microprocessor 58 must be pre-programmed with the values of these parameters.

The invention has been described as incorporating a rotary drum 30 as a collector onto which deposition occurs, but it will be understood that the collector might be of any other suitable shape, for example a plane sheet.

I claim:

1. A method for producing a layer of a metallic material by deposition from the vapour phase onto a collector so as to form the layer thereon, wherein the method includes passing a heat transfer fluid through ducts in thermal contact with the collector, measuring the thickness of the layer, and adjusting the temperature of the inflowing heat transfer fluid in accordance with the thickness of the layer so as to maintain the outer surface of the layer at a predetermined temperature.

2. A method as claimed in claim 1 including measuring the temperature of the inflowing fluid and that of the outflowing fluid, and controlling the flow rate of the heat transfer fluid to maintain a desired difference between the said measured temperatures.

3. A method as claimed in claim 1 wherein, prior to commencing deposition from the vapour phase, the heat transfer fluid is passed through the ducts to heat the collector to a predetermined temperature.

4. A metal vapor deposition apparatus for deposition from the vapour phase of a layer of a metallic material comprising, a chamber adapted to be evacuated, a heated source within the chamber for evaporating the constituents of the metallic material, a collector within the chamber for deposition of the layer thereon, ducts in thermal contact with the collector for passage of a heat transfer fluid, means for causing the fluid to flow through the ducts, means for controlling the temperature of the fluid, and sensing means for determining the thickness of the layer, the temperature control means controlling the temperature of the fluid in accordance with the thickness of the layer so as to maintain the outer surface of the layer at a predetermined temperature.

5. A metal vapor deposition apparatus comprising collector means, means for producing a layer of a metallic material by deposition from the vapor phase onto the collector means so as to form the layer thereon, and means for passing a heat transfer fluid through ducts in thermal contact with the collector, wherein the improvement comprises means for measuring the thickness of the layer during deposition, and means for adjusting the temperature of the inflowing heat transfer fluid and hence the heat transfer between the fluid, the collector and the layer in accordance with the measured thickness of the layer so as to control and maintain the temperature of the outer surface of the layer at predetermined temperature conditions.

* * * * *